United States Patent (10) Patent No.: US 8,355,282 B2
Ching et al. (45) Date of Patent: Jan. 15, 2013

(54) LOGIC-BASED MULTIPLE TIME PROGRAMMING MEMORY CELL

(75) Inventors: Wen-Hao Ching, Hsinchu County (TW); Shih-Chen Wang, Taipei (TW); Ching-Sung Yang, Hsinchu (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 264 days.

(21) Appl. No.: 12/818,095

(22) Filed: Jun. 17, 2010

(65) Prior Publication Data

US 2011/0310669 A1 Dec. 22, 2011

(51) Int. Cl.
*G11C 16/04* (2006.01)

(52) U.S. Cl. .......... 365/185.15; 365/185.18; 365/185.28

(58) Field of Classification Search ............. 365/185.15, 365/185.18, 185.28
See application file for complete search history.

(56) References Cited

U.S. PATENT DOCUMENTS

| 5,594,687 | A | * | 1/1997 | Lin et al. .................... 365/185.1 |
| 7,209,392 | B2 | | 4/2007 | Chen |
| 7,263,001 | B2 | | 8/2007 | Wang |
| 7,382,658 | B2 | | 6/2008 | Fang |
| 7,391,647 | B2 | | 6/2008 | Fang |
| 7,423,903 | B2 | | 9/2008 | Lin |
| 2010/0157669 | A1 | * | 6/2010 | Audzeyeu et al. ......... 365/185.1 |

* cited by examiner

*Primary Examiner* — Pho M Luu
*Assistant Examiner* — Thao Bui
(74) *Attorney, Agent, or Firm* — Winston Hsu; Scott Margo

(57) ABSTRACT

A non-volatile memory system includes one or more non-volatile memory cells. Each non-volatile memory cell provides a floating gate, a coupling device, a first floating gate transistor, and a second floating gate transistor. The coupling device is located in a first conductivity region. The first floating gate transistor is located in a second conductivity region, and supplies read current sensed during a read operation. The second floating gate transistor is located in a third conductivity region. Such non-volatile memory cell further provides two transistors for injecting negative charge into the floating gate during a programming operation, and removing negative charge from the second floating gate transistor during an erase operation. The floating gate is shared by the first floating gate transistor, the coupling device, and the second floating gate transistor, and extends over active regions of the first floating gate transistor, the coupling device and the second floating gate transistor.

10 Claims, 8 Drawing Sheets

|      | CL   | WL   | BL1    | SL1 | PW | BL2    | SL2  | NW   |
|------|------|------|--------|-----|----|--------|------|------|
| PGM1 | 4-7  | 0-7  | 0 or F | 0   | 0  | 0      | 5-8  | 5-8  |
| PGM2 | 5-12 | <0   | 0 or F | 0   | 0  | F      | 0    | 5-8  |
| PGM3 | 5-12 | 5-8  | 0 or F | 0   | 0  | 0      | F    | 5-8  |
| ERS  | 0    | 0-20 | 0 or F | 0   | 0  | 0 or F | 5-20 | 5-20 |
| READ | 1-5  | 1-5  | 1-5    | 0   | 0  | 0 or F | 0-5  | 0-5  |

FIG. 6

|  | CL | WL | SG | EL | BL | SL | PW |
|---|---|---|---|---|---|---|---|
| PGM | 5-20 | 0 | 1-5 | 5-20 | 0 | 0 | 0 |
| ERS | 0 | 0-5 | 0-5 | 5-20 | 0 | 0 | 0 |
| READ | 1-5 | 1-5 | 1-5 | 0-5 | 1-5 | 0 | 0 |
| PGM Inhibit | 5-20 | 0 | 1-5 | 5-20 | 1-7 | 0 | 0 |

FIG. 7

LOGIC-BASED MULTIPLE TIME PROGRAMMING MEMORY CELL

BACKGROUND OF THE INVENTION

1. Field of the Invention

The present invention relates to multiple time programming (MTP) memory cells, and more particularly, to a logic-based MTP memory cell compatible with generic complementary metal-oxide-semiconductor (CMOS) processes.

2. Description of the Prior Art

As diverse types of circuit blocks are integrated into single integrated circuits (ICs), it becomes desirous to integrate non-volatile memory blocks with logic function blocks. However, many non-volatile memory processes require stacked gate structures, which are not available in conventional logic gate fabrication processes, e.g. semiconductor processes using only one polysilicon layer and no special charge-trapping structures.

U.S. Pat. No. 7,382,658 (hereinafter '658), U.S. Pat. No. 7,391,647 (hereinafter '647), U.S. Pat. No. 7,263,001 (hereinafter '001), U.S. Pat. No. 7,423,903 (hereinafter '903), U.S. Pat. No. 7,209,392 (hereinafter '392) teach various architectures for forming memory cells. '658 teaches one p-type access transistor sharing its floating gate with one n-type metal-oxide-semiconductor capacitor (n-MOSC). '647 teaches one p-type access transistor with one p-type metal-oxide-semiconductor capacitor (p-MOSC) and one n-MOSC. '001 teaches one p-type access transistor sharing a floating gate with two p-MOSCs. '903 teaches a p-type field effect transistor (P-FET) for programming through channel hot electron (CHE) injection, and an n-type field effect transistor (N-FET) for erasing through Fowler-Nordheim (FN) tunneling. '392 teaches one n-type metal-oxide-semiconductor field effect transistor (n-MOSFET) sharing its floating gate with one p-type metal-oxide-semiconductor field effect transistor (p-MOSFET), each transistor coupled to its own access transistor.

Please refer to FIG. 1, which is a diagram of a non-volatile memory cell shown in '392. The non-volatile memory cell comprises a first p-type metal-oxide-semiconductor (PMOS) transistor $T_1$, a second PMOS transistor $T_2$, a first n-type metal-oxide-semiconductor (NMOS) transistor $T_3$, and a second NMOS transistor $T_4$. The first PMOS transistor $T_1$ and the first NMOS transistor $T_3$ are access transistors for the second PMOS transistor $T_2$ and the second NMOS transistor $T_4$, respectively, and are controlled by a control voltage $V_{SG}$. Input terminals of the first PMOS transistor $T_1$ and the first NMOS transistor $T_3$ receive a select line voltage $V_{SL}$, and input terminals of the second PMOS transistor $T_2$ and the second NMOS transistor $T_4$ receive a first bit line voltage $V_{BL1}$ and a second bit line voltage $V_{BL2}$, respectively. The second NMOS transistor $T_4$ and the second PMOS transistor $T_2$ share a floating gate.

SUMMARY OF THE INVENTION

According to an embodiment, a non-volatile memory cell comprises a floating gate, a coupling device located in a first conductivity region, a first select transistor serially connected with a first floating gate transistor, both of which are formed in a second conductivity region of a second conductivity type, and a second select transistor serially connected with a second floating gate transistor, both of which are located in a third conductivity region of the first conductivity type. The floating gate is shared by the first floating gate transistor, the second floating gate transistor, and the coupling device.

According to another embodiment, a non-volatile memory cell comprises a floating gate, a coupling device formed in a first conductivity region, a first select transistor serially connected to a first floating gate transistor and a second select transistor, all formed in a second conductivity region of a second conductivity type, and a second floating gate transistor device formed in a third conductivity region of the first conductivity type. The floating gate is shared by the first floating gate transistor, the coupling device, and the second floating gate transistor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 shows program, erase, and read voltages for the non-volatile memory cell of FIG. 2 and FIG. 3 according to an embodiment.

FIG. 7 shows program, erase, read, and program inhibit voltages for the non-volatile memory cell of FIG. 4 and FIG. 5 according to an embodiment.

DETAILED DESCRIPTION

Figure 1:
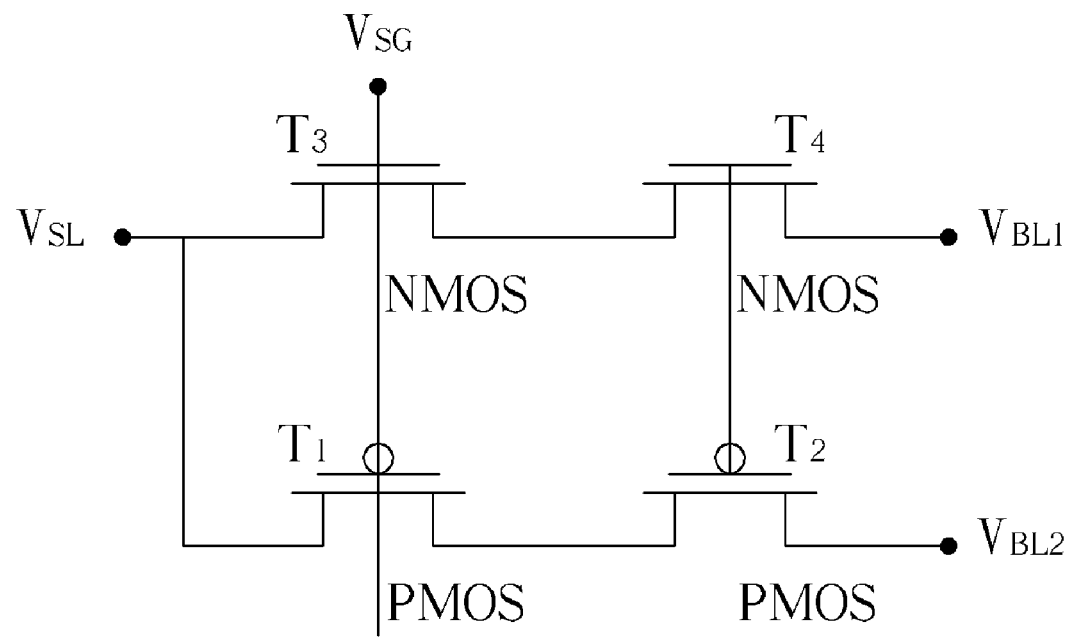
FIG. 1 is a diagram of a non-volatile memory cell.
Figure 2:
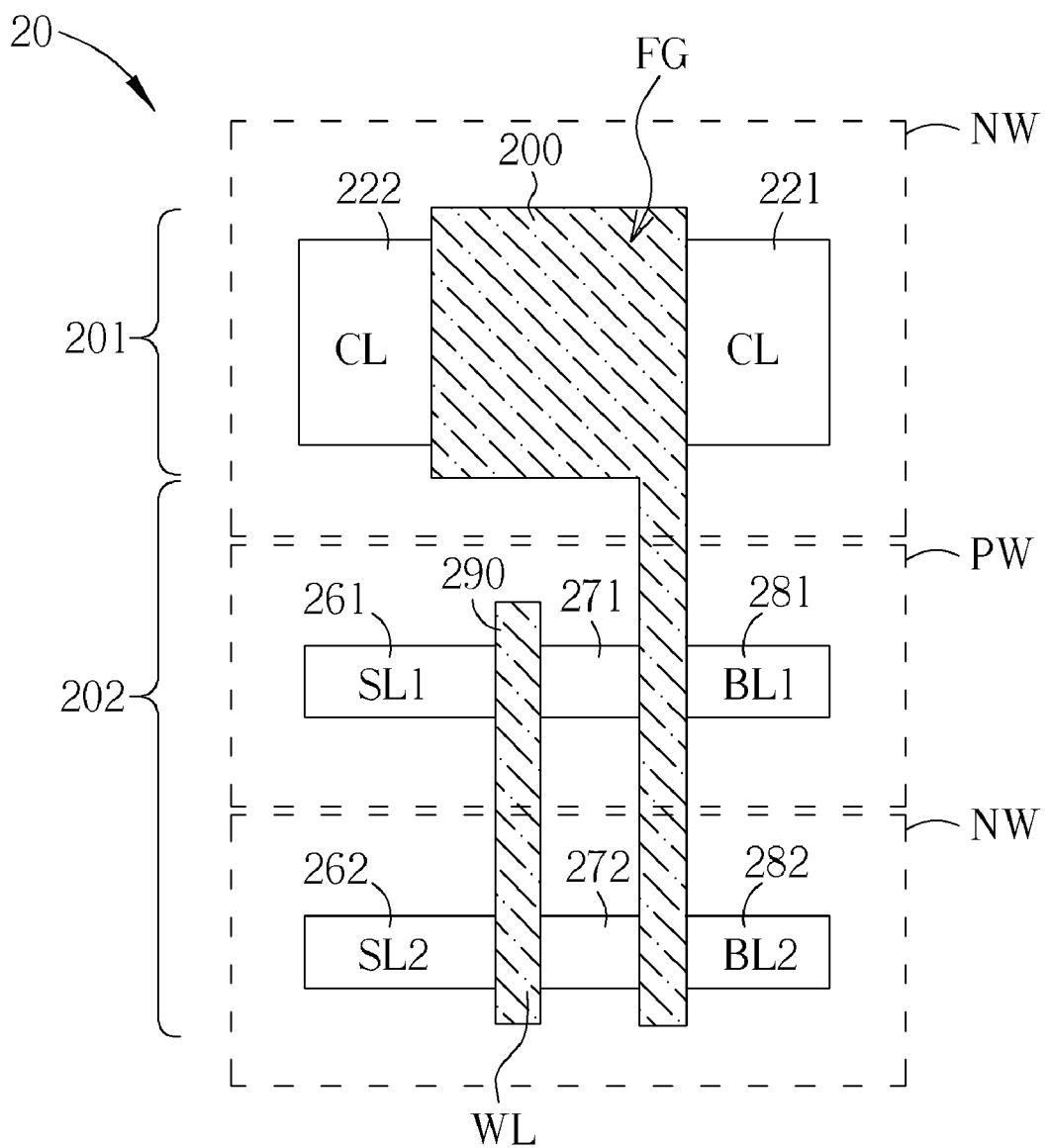
FIG. 2 is a diagram of a non-volatile memory cell according to an embodiment.
Figure 3:
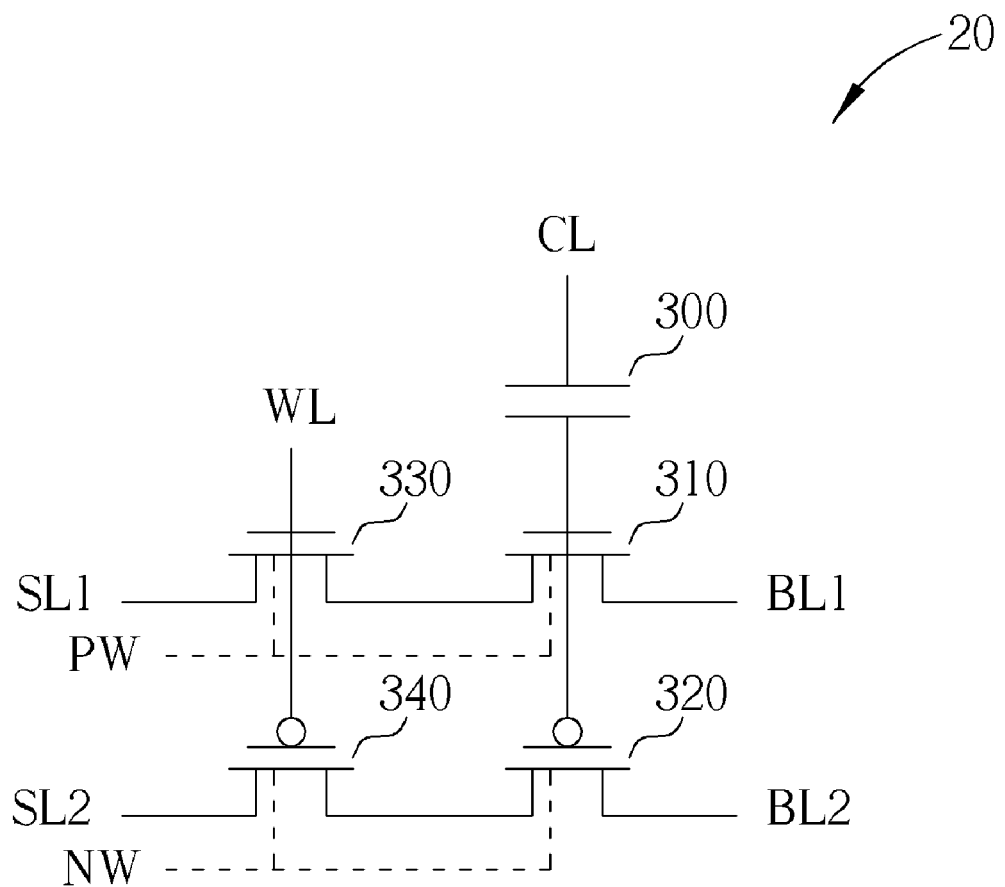
FIG. 3 schematically illustrates the non-volatile memory cell of FIG. 2.

Please refer to FIG. 2 and FIG. 3. FIG. 2 is a diagram showing one embodiment of a non-volatile memory cell 20. FIG. 3 schematically illustrates the non-volatile memory cell 20 of FIG. 2. The non-volatile memory cell 20 shown in FIG. 2 may be formed on and in a substrate. The substrate may be p-type or n-type. The non-volatile memory cell 20 may comprise a floating gate (FG) 200, a control line (CL), a word line (WL) 290, a first source line (SL1), a first bit line (BL1), a second source line (SL2), and a second bit line (BL2). Taking a p-type substrate as an example, the control line (CL) of the non-volatile memory cell 20 may comprise a first diffusion region 221 and a second diffusion region 222 formed over a first conductivity region of a first conductivity type, such as an n-well (NW). Third, fourth, and fifth diffusion regions 261, 271, 281 may be formed over a second conductivity region of a second conductivity type, such as a p-well (PW). Sixth, seventh, and eighth diffusion regions 262, 272, 282 may be formed over a third conductivity region of the first conductivity type, such as another N-well (NW). The p-well (PW) may be located between the two n-wells (NW). As shown in FIG. 2, the first conductivity region is the first conductivity type, and the second conductivity region is located between the first conductivity region and the third conductivity region. In another embodiment, the first conductivity region is the second conductivity type and the third conductivity region is located between the first conductivity region and the second conductivity region. The floating gate (FG) 200 may comprise a first gate part 201 formed between the first diffusion region 221 and the second diffusion region 222, and a second gate part 202 formed between the fourth diffusion region 271 and the fifth diffusion region 281; and between the seventh diffusion region 272 and the eighth diffusion region 282. The first gate part 201 and the second gate part 202 may be formed of a same polysilicon layer, and may be continuous. Gate area of the first gate part 201 may be greater than gate area of the second gate part 202. The word line (WL) 290 may be formed of the same polysilicon layer as the floating gate (FG) 200. The word line (WL) 290 may be formed between the third and fourth diffusion regions 261, 271; and between the sixth and seventh diffusion regions 262,272. The first and second diffusion regions 221, 222 may be N+ diffusion regions. The third, fourth, and fifth diffusion regions 261, 271, 281 may be N+ diffusion regions. The sixth, seventh, and eighth diffusion regions 262, 272, 282 may be P+ diffusion regions. The non-volatile memory cell 20 may be fabricated in a single poly-silicon complementary metal-oxide-semiconductor (CMOS) process.

Referring to FIG. 2 and FIG. 3, the first gate part 201 and the control line CL may form a coupling device 300, which may be formed by a metal-oxide-semiconductor (MOS) capacitor or a metal-oxide-semiconductor field effect transistor (MOSFET). The second gate part 202 may form a first n-type metal-oxide-semiconductor transistor (NMOS) transistor 310 with the fourth and fifth N+ diffusion regions 271, 281, and a first p-type metal-oxide-semiconductor transistor (PMOS) transistor 320 with the seventh and eighth P+ diffusion regions 272, 282. The word line (WL) 290 may form a second NMOS transistor 330 with the third and fourth N+ diffusion regions 261, 271, and a second PMOS transistor 340 with the sixth and seventh P+ diffusion regions 262, 272. The first source line SL1 may be electrically connected to the third diffusion region 261, which may be a source diffusion region of the second NMOS transistor 330. The first bit line BL1 may be electrically connected to the fifth diffusion region 281, which may be a drain diffusion region of the first NMOS transistor 310. The second source line SL2 may be electrically connected to the sixth diffusion region 262, which may be a source diffusion region of the second PMOS transistor 340. The second bit line BL2 may be electrically connected to the eighth diffusion region 282, which may be a drain diffusion region of the first PMOS transistor 320. The fourth diffusion region 271 may function simultaneously as the source diffusion region of the first NMOS transistor 310 and the drain diffusion region of the second NMOS transistor 330. The seventh diffusion region 272 may function simultaneously as the source diffusion region of the first PMOS transistor 320 and the drain diffusion region of the second PMOS transistor 340. The first NMOS transistor 310 and the first PMOS transistor 320 are the first and second floating gate transistors, respectively, and the second NMOS transistor 330 and the second PMOS transistor 340 are the first and second select transistors, respectively.

Figure 4:
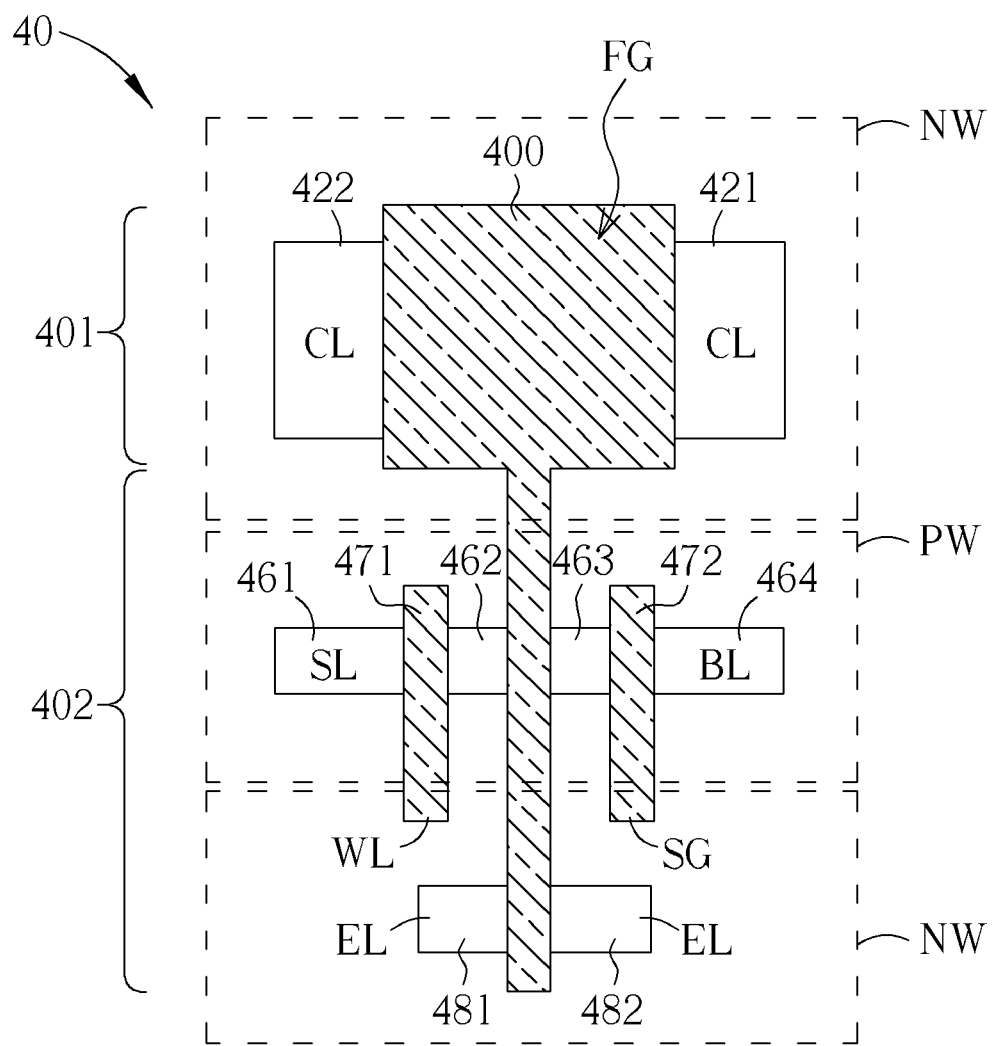
FIG. 4 is a diagram of a non-volatile memory cell according to another embodiment.
Figure 5:
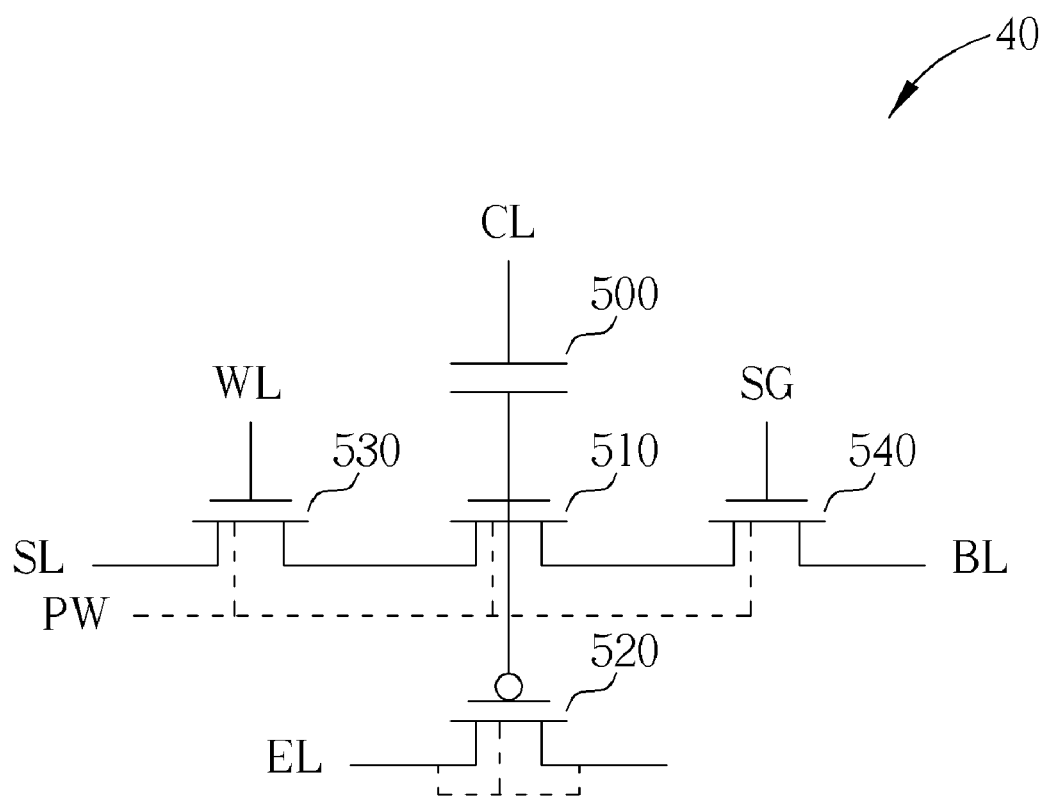
FIG. 5 schematically illustrates the non-volatile memory cell of FIG. 4.

Please refer to FIG. 4 and FIG. 5. FIG. 4 is a diagram of a non-volatile memory cell 40 according to another embodiment to improve a cell's inhibiting capability while its neighbor cells are being programmed. FIG. 5 schematically illustrates the non-volatile memory cell 40 of FIG. 4. The non-volatile memory cell 40 shown in FIG. 4 may be formed on and in a substrate. The substrate may be p-type or n-type. The non-volatile memory cell 40 may comprise a floating gate (FG) 400, a word line (WL) 471, a select gate (SG) 472, a control line (CL), a source line (SL), a bit line (BL), and an erase line (EL), while applying SG to achieve the said improvement. Taking a p-type substrate as an example, the non-volatile memory cell 40 may further comprise a first diffusion region 421 and a second diffusion region 422 formed over a first conductivity region of a first conductivity type, such as an n-well (NW). Third, fourth, fifth, and sixth diffusion regions 461, 462, 463, 464 may be formed in a second conductivity region of a second conductivity type, such as a p-well (PW). Seventh and eighth diffusion regions 481, 482 may be formed in a third conductivity region of the first type, such as another n-well (NW). The p-well (PW) may be located between the two n-wells (NW). The first conductivity region is the first conductivity type and the second conductivity region may be located between the first conductivity region and the third conductivity region. In another embodiment, the first conductivity region is the second conductivity type and the third conductivity region is located between the first conductivity region and the second conductivity region. The floating gate (FG) 400 may comprise a first gate part 401 formed between the first and second diffusion regions 421, 422, and a second gate part 402 formed between the fourth and fifth diffusion regions 462, 463; and between the seventh and eighth diffusion regions 481, 482. The first gate part 401 and the second gate part 402 may be formed of a same polysilicon layer, and may be continuous. The first gate part 401 may have greater area than the second gate part 402. The word line (WL) 471 and the select gate (SG) 472 may be formed of the same polysilicon layer as the floating gate (FG) 400. The word line (WL) 471 may be formed between the third and fourth diffusion regions 461,462. The select gate (SG) 472 may be formed between the fifth and sixth diffusion regions 463, 464. The first and second diffusion regions 421, 422 may be N+ diffusion regions. The third, fourth, fifth, and sixth diffusion regions 461, 462, 463, 464 may be N+ diffusion regions. The seventh and eighth diffusion regions 481, 482 may be P+ diffusion regions. The non-volatile memory cell 40 may be fabricated in a single poly-silicon CMOS process.

Referring to FIG. 4 and FIG. 5, the first gate part 401 and the control line (CL) may form a coupling device 500, which may be formed by a metal-oxide-semiconductor (MOS) capacitor or a MOS field effect transistor (MOSFET). The second gate part 402 may form a first n-type metal-oxide-semiconductor transistor (NMOS) transistor 510 with the fourth and fifth N+ diffusion regions 462, 463, and a p-type metal-oxide-semiconductor transistor (PMOS) transistor 520 with the seventh and eighth diffusion regions 481, 482. The word line (WL) 471 may form a second NMOS transistor 530 with the N+ third and fourth diffusion regions 461, 462. The select gate (SG) 472 may form a third NMOS transistor 540 with the N+ fifth and sixth diffusion regions 463, 464. The source line (SL) may be electrically connected to the third diffusion region 461, which may be a source diffusion region of the second NMOS transistor 530. The bit line BL may be electrically connected to the sixth diffusion region 464, which may be a drain diffusion region of the third NMOS transistor 540. The erase line EL may be electrically connected to the seventh and eighth diffusion regions 481, 482 of the PMOS transistor 520. The fourth diffusion region 462 may function as both the source diffusion region of the first NMOS transistor 510 and the drain diffusion region of the second NMOS transistor 530. The fifth diffusion region 463 may function as both the drain diffusion region of the first NMOS transistor 510 and the source diffusion region of the third NMOS transistor 540. The first NMOS transistor 510 and the PMOS transistor 520 may form a first floating gate transistor and a second floating gate transistor device, respectively, and the second NMOS transistor 530 and the third NMOS transistor 540 may form a first select transistor and a second select transistor, respectively. In another embodiment, the second floating gate transistor device may be formed by a MOS capacitor.

FIG. 6 shows programming, erase, and read voltages for the non-volatile memory cell 20 of FIG. 2 and FIG. 3 according to an embodiment. During programming, a control line voltage equal to a programming voltage (VPP) minus a threshold voltage (Vth) may be applied to the control line (CL). The programming voltage (VPP) may be in a range from 5 Volts to 8 Volts, and the threshold voltage (Vth) may be approximately 1 Volt. Thus, voltage applied to the control line (CL) may be in a range from 4 Volts to 7 Volts. The word line (WL) 290 may be in a range from 0 Volts to 7 Volts. The first source line (SL1), the first bit line (BL1), the second bit line (BL2), and the p-well (PW) may be grounded. The first bit line (BL1) may also be floating. The programming voltage (VPP) may be applied to the second source line (SL2) and the n-well (NW). In such a programming configuration, the control line voltage may be coupled through the MOS capacitor 300 to the floating gate 200 according to ratio of size of the MOS capacitor 300 and size of the PMOS transistor 320. For example, if the control line voltage equals 6 Volts, and the ratio is 9:1, potential at the floating gate 200 may be 5.4 Volts (nine-tenths of 6 Volts). During programming, channel hot electron (CHE) injection may occur at the PMOS transistor 320. Electrons from the source diffusion region of the PMOS transistor 320 may be injected into the floating gate 200 through a pinched-off channel formed due to the threshold voltage across the floating gate 200 and the source diffusion region of the PMOS transistor 320, and the programming voltage VPP across the source diffusion region and the drain diffusion region of the PMOS transistor 320. During an erase operation, Fowler-Nordheim (FN) electron tunneling ejection may occur at the PMOS transistor 320 when an erase voltage (VEE) is applied to the second source line (SL2), and the n-well (NW). The second bit line (BL2) may be 0 Volts or floating. The word line (WL) 290 may be in a range from 0 Volts to 20 Volts. The control line (CL), the first source line (SL1), the first bit line (BL1), and the p-well (PW) are grounded. The first bit line (BL1) may also be floating. The erase voltage (VEE) may be in a range from 5 Volts to 20 Volts. In this way, the electrons that were injected into the floating gate 200 may be ejected from the floating gate 200.

In another embodiment, during programming, a control line voltage equal to a first programming voltage (VPP1) may be applied to the control line (CL). The first programming voltage (VPP1) may be in a range from 5 Volts to 12 Volts. The first source line (SL1), the second source line (SL2), the first bit line (BL1), and the p-well (PW) may be grounded. The first bit line (BL1) may also be floating. A second programming voltage (VPP2) may be applied to the n-well (NW). The second programming voltage (VPP2) may be in a range from 5 Volts to 8 Volts. A third programming voltage (VPP3) may be applied to the word line (WL). The third programming voltage (VPP3) may be lower than 0 Volts. The second bit line (BL2) may float. In such a programming configuration, band-to-band tunneling-induced hot electron (BBHE) injection may occur at the PMOS transistor 320. During an erase operation, Fowler-Nordheim (FN) electron tunneling ejection may occur at the PMOS transistor 320 when the erase voltage (VEE) is applied to the second source line (SL2), and the n-well (NW). The word line (WL) 290 may be in a range from 0 Volts to 20 Volts. The control line (CL), the first source line (SL1), and the p-well (PW) are grounded. The first bit line (BL1) may be 0 Volts or floating. The second bit line (BL2) may be 0 Volts or floating. The erase voltage (VEE) may be in a range from 5 Volts to 20 Volts. In this way, the electrons that were injected into the floating gate 200 may be ejected from the floating gate 200.

In a third programming mode (PGM3), the control line (CL) voltage may be in a range from 5 Volts to 12 Volts, the word line (WL) voltage may be in a range from 5 Volts to 8 Volts, the second source line (SL2) voltage may be floating, and the n-well (NW) voltage may be 5 Volts to 8 Volts. The first bit line (BL1) voltage, the first source line voltage (SL1), the p-well (PW) voltage, and the second bit line (BL2) voltage may be grounded, e.g. 0 Volts. The first bit line (BL1) may also be floating. In such a programming configuration, band-to-band tunneling-induced hot electron (BBHE) injection may occur at the PMOS transistor 320. During an erase operation, Fowler-Nordheim (FN) electron tunneling ejection may occur at the PMOS transistor 320 when the erase voltage (VEE) is applied to the second source line (SL2), and the n-well (NW). The word line (WL) 290 may be in a range from 0 Volts to 20 Volts. The control line (CL), the first source line (SL1), and the p-well (PW) are grounded. The first bit line (BL1) may be 0 Volts or floating. The second bit line (BL2) may be 0 Volts or floating. The erase voltage (VEE) may be in a range from 5 Volts to 20 Volts. In this way, the electrons that were injected into the floating gate 200 may be ejected from the floating gate 200.

During a read operation, a first voltage (VCC1) may be applied to the control line (CL) and the word line (WL), a second voltage (VCC2) may be applied to the second source line (SL2) and the n-well (NW), and a read voltage (VRR) may be applied to the first bit line (BL1). The first voltage (VCC1) and the read voltage (VRR) may be in a range from 1 Volt to 5 Volts. The second voltage (VCC2) may be in a range from 0 Volts to 5 Volts. The second bit line (BL2) may be 0 Volts or floating. The first source line (SL1) and the p-well (PW) may be grounded. Through capacitive coupling of the PMOS capacitor 300, some portion of the first voltage (VCC1), e.g. nine-tenths, may be coupled to the floating gate 200. If the non-volatile memory cell 20 is erased, potential at the floating gate 200 may be sufficient to turn on the NMOS transistor 310. Due to the read voltage (VRR) applied to the first bit line (BL1), as well as the first source line (SL1) being grounded, read current may flow through the NMOS transistor 310. The read current may be detected to indicate a positive logical state. If the non-volatile memory cell 20 is programmed, the electrons injected into the floating gate 200 may be sufficient to cancel out, or significantly lower, the portion of the first voltage coupled to the floating gate 200, such that the NMOS transistor 310 may remain off, or may turn on with a read current substantially lower than the read current detected when the non-volatile memory cell 20 is erased. In this way, the lower read current may be detected to indicate a negative logical state. Utilization of the higher read current to indicate the positive logical state and the lower read current to indicate the negative logical state is only one example, and should not be considered limiting. The higher read current may also be utilized to correspond to the negative logical state, and the lower read current may be utilized to correspond to the positive logical state.

FIG. 7 shows programming, erase, and read voltages for the non-volatile memory cell 40 of FIG. 4 and FIG. 5 according to an embodiment. During programming, a control line voltage in a range from 5 Volts to 20 Volts may be applied to the control line (CL) and the erase line (EL). A first voltage (VCC) may be applied to the select gate (SG). The first voltage (VCC) may be in a range from 1 Volt to 5 Volts. The word line (WL), source line (SL), the bit line (BL), and the p-well (PW) may be grounded. In such a programming configuration, the control line voltage may be coupled through the MOS capacitor 500 to the floating gate 400 according to ratio of size of the MOS capacitor 500 and size of the first NMOS transistor 510. For example, if the control line voltage equals 6 Volts, and the ratio is 9:1, potential at the floating gate 400 may be 5.4 Volts (nine-tenths of 6 Volts). During programming, FN electron tunneling injection may occur at the first NMOS transistor 510. During an erase operation, Fowler-Nordheim (FN) electron tunneling ejection may occur at the PMOS transistor 520 when the erase voltage (VEE) is applied to the erase line (EL), and the control line (CL), the source line (SL), the bit line (BL), and the p-well (PW) are grounded. The word line (WL) and the select gate (SG) may be in a range from 0 Volts to 5 Volts. The erase voltage (VEE) may be in a range from 5 Volts to 20 Volts. In this way, the electrons that were injected into the floating gate 400 during programming may be ejected from the floating gate 400 during erasing.

During a read operation, a first voltage (VCC1) may be applied to the control line (CL), the word line (WL) and the select gate (SG), a second voltage (VCC2) may be applied to the erase line (EL), and a read voltage (VRR) may be applied to the bit line (BL). The first voltage (VCC1) and the read voltage (VRR) may be in a range from 1 Volt to 5 Volts. The second voltage (VCC2) may be in a range from 0 Volt to 5 Volts. The source line (SL), and the p-well (PW) may be grounded. Through capacitive coupling of the MOS capacitor 500, some portion of the first voltage (VCC1), e.g. nine-tenths, may be coupled to the floating gate 400. If the non-volatile memory cell 40 is erased, potential at the floating gate 400 may be sufficient to turn on the first NMOS transistor 510. Due to the read voltage (VRR) applied to the bit line (BL), as well as the source line (SL) being grounded, read current may flow through the first NMOS transistor 510. The read current may be detected to indicate a positive logical state. If the non-volatile memory cell 40 is programmed, the electrons injected into the floating gate 400 may be sufficient to cancel out, or significantly lower, the portion of the first voltage coupled to the floating gate 400, such that first the NMOS transistor 510 may remain off, or may turn on with a read current substantially lower than the read current detected when the non-volatile memory cell 40 is erased. In this way, the lower read current may be detected to indicate a negative logical state. In some embodiments, the higher read current may correspond to the negative logical state, and the lower read current may correspond to the positive logical state.

Figure 8:
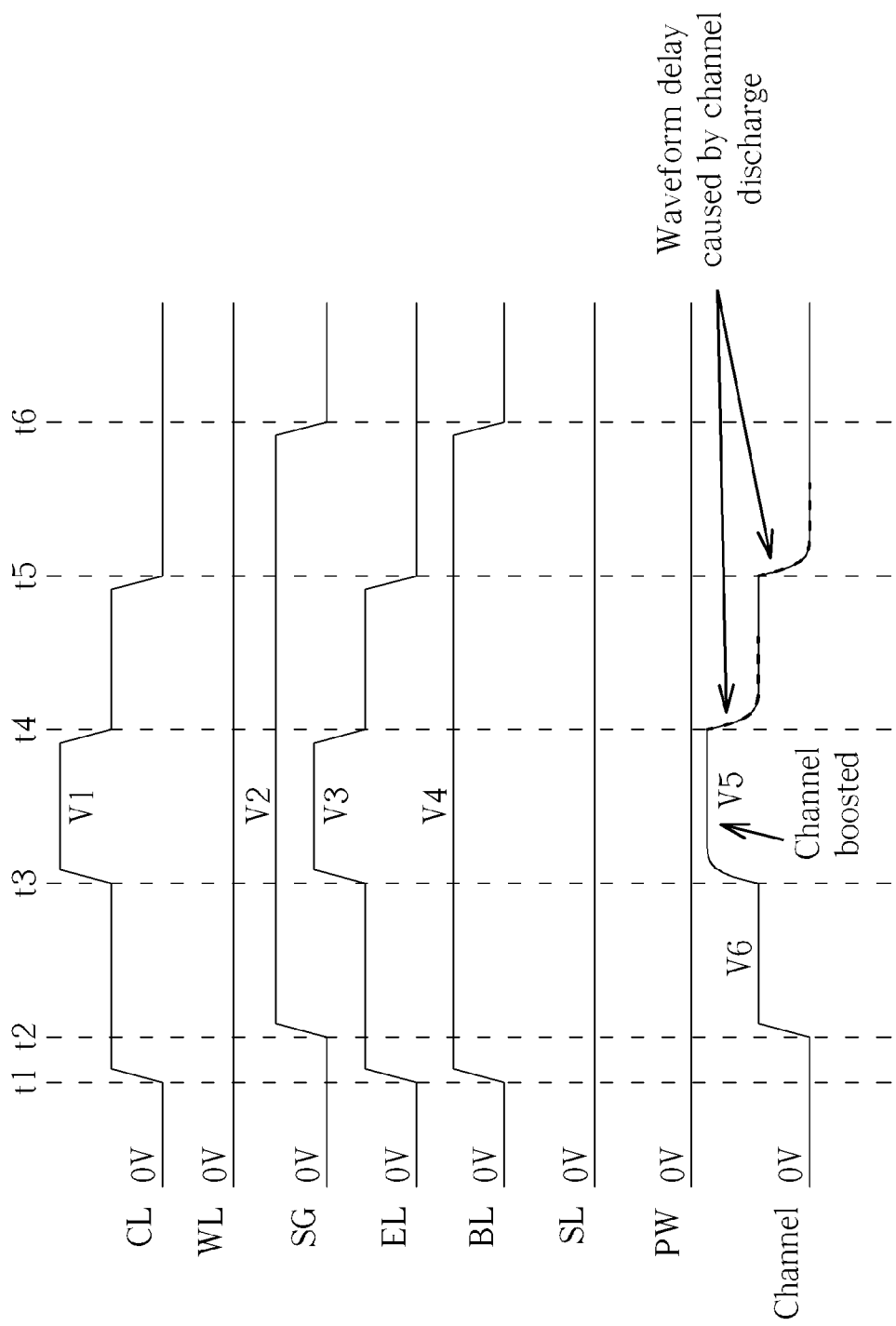
FIG. 8 is a waveform diagram illustrating a program inhibit operation in the non-volatile memory cell of FIG. 4 and FIG. 5.

Please refer to FIG. 8, which is a waveform diagram illustrating a program inhibit operation in the non-volatile memory cell of FIG. 4 and FIG. 5. The waveform diagram of FIG. 8 shows control line voltage applied to the control line (CL), word line voltage applied to the word line (WL), select gate voltage applied to the select gate (SG), erase line voltage applied to the erase line (EL), bit line voltage applied to the bit line (BL), source line voltage applied to the source line (SL), p-well voltage applied to the p-well (PW), and channel voltage of the first NMOS transistor 510, which is boosted from a third time (t3) to a fourth time (t4) during the program inhibit operation. As shown, the channel voltage reaches a sixth voltage (V6) in a period from a second time (t2) to the third time (t3). From the third time (t3) to the fourth time (t4), the control line voltage is at a first voltage (V1), the select gate voltage is at a second voltage (V2), the erase line voltage is at a third voltage (V3), the bit line voltage is at a fourth voltage (V4), and the channel is at a fifth voltage (V5). During the program inhibit operation, the voltages V1-V6 may be configured, such that $V1 \geq V3 > V5 > V4 \geq V2 > V6$. During a program operation, the voltages V1-V6 may be configured, such that $V1 \geq V3 \geq V2 > V4 = V5 = V6 \geq 0V$. For example, as shown in FIG. 7, during the program inhibit operation, the control line voltage may be in a range from 5 Volts to 20 Volts, the word line voltage may be 0 Volts, the select gate voltage may be in a range from 1 Volt to 5 Volts, the erase line voltage may be in a range from 5 Volts to 20 Volts, the bit line voltage may be in a range from 1 Volt to 7 Volts, and the source line voltage and p-well voltage may both be 0 Volts.

The non-volatile memory cells 20, 40 described above are all fully compatible with generic CMOS processes, require relatively small layout area, and exhibit good programming and erase speed, endurance, and data retention, without degradation of the cycling window.

Those skilled in the art will readily observe that numerous modifications and alterations of the device and method may be made while retaining the teachings of the invention.

What is claimed is:

1. A non-volatile memory cell comprising:
   a floating gate;
   a coupling device located in a first conductivity region;
   a first select transistor serially connected with a first floating gate transistor, both of which are formed in a second conductivity region of a second conductivity type;
   a second select transistor serially connected with a second floating gate transistor, both of which are located in a third conductivity region of a first conductivity type;
   a control line electrically connected to the coupling device;
   a word line electrically connected to a gate electrode shared by the first select transistor and the second select transistor;
   a first bit line electrically connected to a drain region of the first floating gate transistor;
   a first source line electrically connected to a source region of the first select transistor;
   a second bit line electrically connected to a drain region of the second floating gate transistor; and
   a second source line electrically connected to a source region of the second select transistor;
   wherein the second conductivity region is a first well, and the third conductivity region is a second well and wherein the floating gate is shared by the first floating gate transistor, the second floating gate transistor, and the coupling device.

2. The non-volatile memory cell of claim 1 wherein during a read operation, a control line voltage applied to the control line, a word line voltage applied to the word line, a first bit line voltage applied to the first bit line, a first source line voltage applied to the first source line, a second bit line voltage applied to the second bit line, a second source line voltage applied to the second source line, a first well voltage applied to the first well, and a second well voltage applied to the second well are configured for sensing current conducted through the serially-connected first select transistor and the first floating gate transistor.

3. The non-volatile memory cell of claim 2, wherein:
   the control-line voltage is in a range from 1V to 5V;
   the word-line voltage is in a range from 1V to 5V;
   the first bit-line voltage is in a range from 1V to 5V;
   the first source-line voltage is 0V;
   the first well voltage is 0V;
   the second bit-line voltage is 0V or floating;
   the second source-line voltage is in a range from 0V to 5V; and
   the second well voltage is in a range from 0V to 5V.

4. The non-volatile memory cell of claim 1 wherein during a program operation, a control line voltage applied to the control line, a word line voltage applied to the word line, a first bit line voltage applied to the first bit line, a first source line voltage applied to the first source line, a second bit line voltage applied to the second bit line, a second source line voltage applied to the second source line, a first well voltage applied to the first well, and a second well voltage applied to the second well are configured for inducing channel hot carrier injection at the second floating gate transistor.

5. The non-volatile memory cell of claim 4, wherein:
the control-line voltage is in a range from 4V to 7V;
the word-line voltage is in a range from 0V to 7V;
the first bit-line voltage is 0V or floating;
the first source-line voltage is 0V;
the first well voltage is 0V;
the second bit-line voltage is 0V;
the second source-line voltage is in a range from 5V to 8V; and
the second well voltage is in a range from 5V to 8V.

6. The non-volatile memory cell of claim 1 wherein during a program operation, a control line voltage applied to the control line, a word line voltage applied to the word line, a first bit line voltage applied to the first bit line, a first source line voltage applied to the first source line, a first well voltage applied to the first well, and a second well voltage applied to the second well are configured for inducing band-to-band tunneling induced hot carrier injection at the second floating gate transistor.

7. The non-volatile memory cell of claim 6, wherein:
the control-line voltage is in a range from 5V to 12V;
the word-line voltage is lower than 0V;
the first bit-line voltage is 0V or floating;
the first source-line voltage is 0V;
the first well voltage is 0V;
the second bit-line is floating;
the second source-line is applied to 0V; and
the second well voltage is in a range from 5V to 8V.

8. The non-volatile memory cell of claim 6, wherein:
the control-line voltage is in a range from 5V to 12V;
the word-line voltage is in a range from 5V to 8V;
the first bit-line voltage is 0V or floating;
the first source-line voltage is 0V;
the first well voltage is 0V;
the second bit-line is applied to 0V;
the second source-line is floating; and
the second well voltage is in a range from 5V to 8V.

9. The non-volatile memory cell of claim 1 wherein during an erase operation, a control line voltage applied to the control line, a word line voltage applied to the word line, a first bit line voltage applied to the first bit line, a first source line voltage applied to the first source line, a second bit line voltage applied to the second bit line, a second source line voltage applied to the second source line, a first well voltage applied to the first well, and a second well voltage applied to the second well are configured for inducing Fowler-Nordheim tunneling ejection at the second floating gate transistor.

10. The non-volatile memory cell of claim 9, wherein
the control-line voltage is 0V;
the word-line voltage is in a range from 0V to 20V;
the first bit-line voltage is 0V or floating;
the first source-line voltage is 0V;
the first well voltage is 0V;
the second bit-line voltage is 0V or floating;
the second source-line voltage is in a range from 5V to 20V; and
the second well voltage is in a range from 5V to 20V.

* * * * *